(12) United States Patent
Detofsky et al.

(10) Patent No.: US 10,677,845 B2
(45) Date of Patent: Jun. 9, 2020

(54) CONVERGED TEST PLATFORMS AND PROCESSES FOR CLASS AND SYSTEM TESTING OF INTEGRATED CIRCUITS

(71) Applicant: Intel Corporation, Santa Clara, CA (US)

(72) Inventors: Abram M. Detofsky, Tigard, OR (US); Evan M. Fledell, Hillsboro, OR (US); Mustapha A. Abdulai, Hillsboro, OR (US); John M. Peterson, Hillsboro, OR (US); Dinia P. Kitendaugh, Beaverton, OR (US); Pooya Tadayon, Portland, OR (US); Jin Pan, Portland, OR (US); David Shia, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 410 days.

(21) Appl. No.: 15/447,095

(22) Filed: Mar. 1, 2017

(65) Prior Publication Data
US 2018/0252772 A1   Sep. 6, 2018

(51) Int. Cl.
*G01R 31/319* (2006.01)
*G01R 31/28* (2006.01)

(52) U.S. Cl.
CPC . *G01R 31/31908* (2013.01); *G01R 31/31905* (2013.01); *G01R 31/2886* (2013.01)

(58) Field of Classification Search
None
See application file for complete search history.

(56) References Cited

U.S. PATENT DOCUMENTS

2010/0117668 A1* 5/2010 Redlich .............. G01R 31/3025
324/756.07

* cited by examiner

*Primary Examiner* — Paresh Patel
(74) *Attorney, Agent, or Firm* — Thorpe North & Western, LLP; David W. Osborne (57) ABSTRACT

A testing system and process comprises a converged test platform for structural testing and system testing of an integrated circuit device. The testing system comprises a converged test platform supported by a baseboard of an automated test assembly. The converged test platform comprises a DUT socket for testing an integrated circuit device, at least one testing electronic component selectively electrically coupled to the DUT socket by at least one switch operable to electrically switch at least some testing signals between the automated testing assembly and the DUT socket to the at least one testing electronic component for both structural testing and system testing of the integrated circuit device within the same test flow. The switch(es) and testing electronic component(s) (e.g., an FPGA) can be reprogrammable for testing flexibility and faster through put. Associated processes and methods are provided for both class and system testing using the converged test platform for back-end and front-end testing.

28 Claims, 4 Drawing Sheets

CONVERGED TEST PLATFORMS AND PROCESSES FOR CLASS AND SYSTEM TESTING OF INTEGRATED CIRCUITS

TECHNICAL FIELD

Embodiments described herein relate generally to methods, processes, and systems for testing integrated circuits.

BACKGROUND

Quality control and operational testing of electronic components, such as integrated circuits, is an essential part of the development and production process. However, adequate testing that provides meaningful feedback as to the proper feasibility and function of an electronic component typically comes with a significant cost in terms of time and equipment.

BRIEF DESCRIPTION OF THE DRAWINGS

Invention features and advantages will be apparent from the detailed description which follows, taken in conjunction with the accompanying drawings, which together illustrate, by way of example, various invention embodiments; and, wherein.

DESCRIPTION OF EMBODIMENTS

Before invention embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this written description, the singular forms "a," "an" and "the" include express support for plural referents unless the context clearly dictates otherwise. Thus, for example, reference to "a layer" includes a plurality of such layers.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in the written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The term "coupled," as used herein, is defined as directly or indirectly connected in an electrical or nonelectrical manner. "Directly coupled" items or features are in physical contact with one another and/or attached. Objects described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

Example Embodiments

An initial overview of technology embodiments is provided below and specific technology embodiments are then described in further detail. This initial summary is intended to aid readers in understanding the technology more quickly but is not intended to identify key or essential features of the technology nor is it intended to limit the scope of the claimed subject matter.

Integrated circuits typically include various active and passive circuit elements which have been integrated into a piece or substrate of semiconductor material, often referred to as a die. The die may, in turn, be fully or partially encapsulated into a package, which includes a ceramic or plastic substrate although other materials may be used. The package mechanically supports and protects the die which is often relatively fragile.

These packages are usually attached to a printed circuit board through their second level interconnects, which can be pins, balls or other connectors arranged along the exterior of the package. The package may be attached directly to the printed circuit board by soldering or other connection techniques. In some applications, the package may not connect directly to the printed circuit board. Instead, an interposer or socket or other device may provide an intermediate connection between the package and the printed circuit board.

Conductors of the package typically provide separate electrical connection terminals between the printed circuit board (or interposer or socket), and the various inputs and outputs of the integrated circuit or circuits within the package. An integrated circuit die can have electrical connectors such as solder bumps to mechanically and electrically connect the integrated circuit die to the package substrate. Solder bumps or other electrical connectors may also be used to mechanically and electrically connect an integrated circuit die to one or more other such dies in a stack arrangement. In this manner, an electronic system can be formed by connecting various integrated circuit dies to a printed circuit board.

Before it is shipped, a product such as an integrated circuit device may be tested by plugging the product into a test socket of a test board of a testing system. Thus, the socket frequently provides both a mechanical coupling which secures the device under test to the test board, and an electrical coupling to permit electrical signals to pass between the product and the test board.

A programmed test controller often referred to as a "tester" conducts the testing of the product by generating test signals which are directed to the device by the test board which is plugged into a connector of the test controller. The test signals typically include test excitation signals which are routed by the test board to the device being tested. A test excitation signal may include a data signal, an address signal, a control signal, a power signal, a ground signal, etc. In response to the test excitation signals, the product generates test response signals which are routed by the test board back to the test controller for storage and analysis.

As integrated circuit devices have grown more complex, the test board for testing a device has correspondingly grown more complex. In addition to dedicated conductors which pass test signals from the test controller through to the device socket, the test board frequently has complex switching circuitry on board to switch both analog and digital test signals from the test controller over various conductors of the test board to individual pins or connectors of the device socket on the test board. Thus, a test excitation signal may be routed to a first socket pin and then routed to a different socket pin, depending upon the particular test being conducted. Similarly, test response signals from one pin of the device socket may be routed to a particular input of the test controller and then test response signals from a different pin of the device socket may be routed to the same input of the test controller, depending upon the particular test being conducted.

A test board may also have complex logic circuitry on board for generating test excitation signals in response to a test excitation signal from the test controller. The test excitations signals generated on the test board may include complex bit patterns and complex timing sequences of multiple excitation signals which are routed to the device socket on the test board. The logic circuitry on board the test board may also receive test response signals from the device under test and store and analyze the test response signals. For example, the logic circuitry on board the test board may analyze the test response signals from the device under test and provide a pass/fail test response signal to the test controller. Other examples of circuitry on board a test board may include switches and amplifiers.

A test board is typically custom designed for a particular device under test. If the design of a product changes, a new test board is frequently designed and fabricated for testing that new product. Once a product is discontinued, the test board for that product is usually discarded.

Traditional test solutions are divided based on test contents, and separate infrastructures are required to carry out testing (e.g., whether for front-end or back-end testing). This can mean that a particular device under test (DUT) requires multiple steps and multiple testing architectures to fully test the device. For example, front-end testing of a wafer can undergo structural logic testing, and then once packaged, the packaged unit can undergo a number of separate testing steps requiring separate hardware infrastructure. These separate testing steps are typically class and system testing, such as stress testing, structural logic testing, functional and fusing testing, and other common testing processes. Such testing methods and architectures are both costly and time consuming because they require significant modification of existing automation infrastructure, such as requiring adding and/or re-spinning hardware and writing new software for each testing step. This can also bottle-neck overall manufacturing processes.

Accordingly, methods, processes, devices, and systems are disclosed for testing integrated circuits, such as by implementing a converged content socket (e.g., a converged test platform) testing that combines a plurality of class and system testing operations into the converged testing platform having reprogrammable capabilities. In one example, a testing system comprises: an automated testing assembly; a baseboard electrically coupled to the automated testing assembly; and a converged test platform supported by the baseboard. The converged test platform comprises: a device-under-test (DUT) socket configured to electrically receive an integrated circuit device for testing; at least one testing electronic component selectively electrically coupled to the DUT socket; and at least one switch selectively operable to electrically switch at least some testing signals between the automated testing assembly and the DUT socket to the at least one testing electronic component for both structural testing and system testing of the integrated circuit device.

In one example, a process is provided for executing both structural testing and system testing of an integrated circuit device with a converged test platform operable with an automated test assembly. The process comprises: providing an automated test assembly configured to test an integrated circuit device; providing a converged test platform electrically coupled to the automated test assembly, the converged test platform having DUT socket supporting the integrated circuit device, and having at least one testing electronic component and at least one switch; and facilitating switching, with the at least one switch, at least some testing signals between the integrated circuit device and the automated testing assembly to be routed to the at least one testing electronic component to facilitate both structural testing and system testing of the integrated circuit device.

Figure 1:
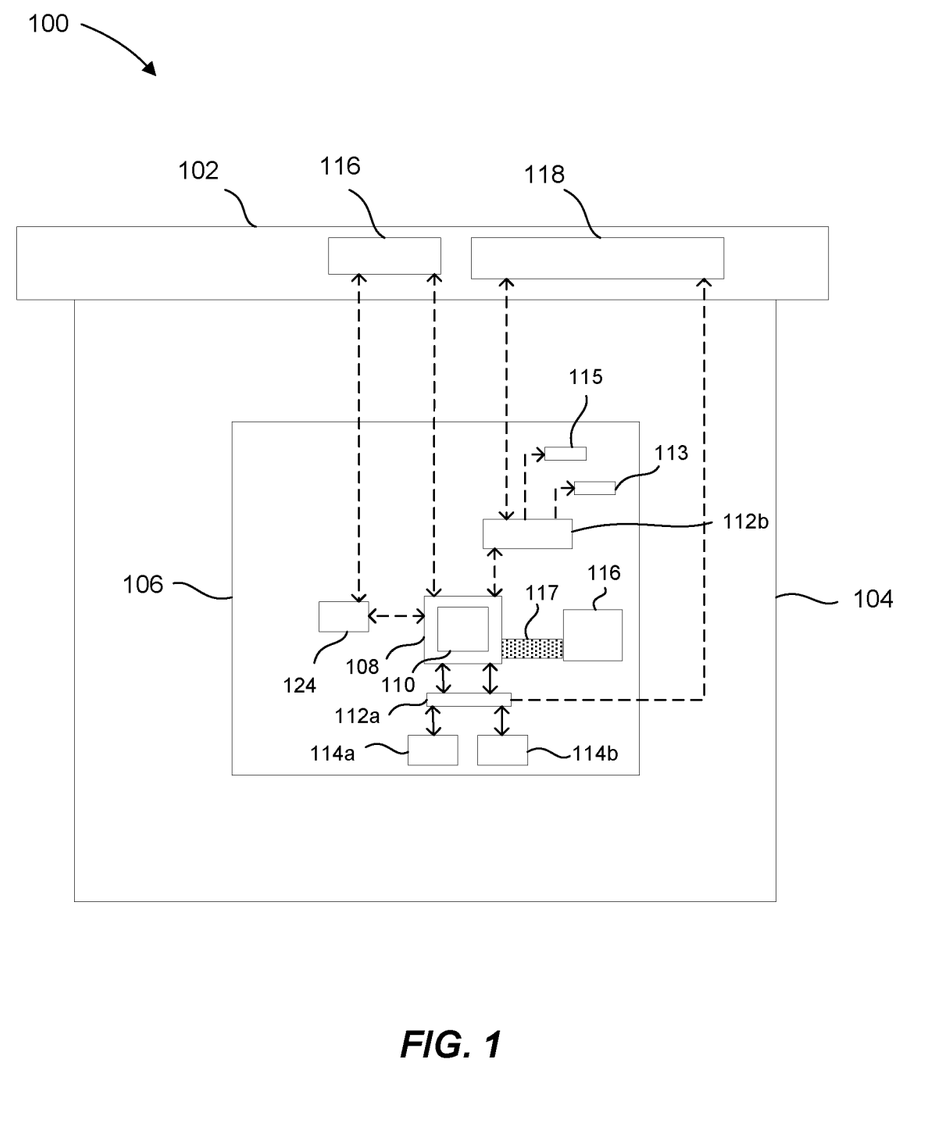
FIG. 1 illustrates a diagram of an automated test system for testing an integrated circuit device according to an example of the present disclosure.

FIG. 1 illustrates a schematic of a testing system 100 in accordance with an example embodiment. The testing system 100 comprises an automated testing assembly 102, which can be a high density modular test (HDMT) assembly, or other automated testing system having a computer system, processor, software, and other known testing components capable of testing integrated circuits. A baseboard 104 is mechanically and electrically coupled to the automated test assembly 102, such as a testing baseboard substrate having a plurality of electronic components, integrated circuits, and other testing components of typical baseboards. A converged test platform 106 can be removably coupled to the baseboard 104 (such as a personality card of a testing system). Notably, the converged test platform 106 comprises a DUT socket 108 configured to electrically receive and support an integrated circuit device 110 under test. The converged test platform 106 can comprise a first plurality of switches 112a and a second plurality of switches 112b, where each switch can be selectively operable to electrically switch at least some testing signals between the automated testing assembly 102 and the DUT socket 108 for both structural testing and system testing of the integrated circuit device 110. Switches such as disclosed herein can each be a multiplexer (or MUX). Other suitable switches can also be used.

In one example, a particular switch of the plurality of switches 112a can be selectively electrically coupled between the DUT socket 108 and a first memory device 114a, and another switch can be electrically coupled between the DUT socket 108 and a second memory device 114b. Alternatively, numerous switches could be coupled in this manner. For purposes of illustration and discussion, only one switch of the pluralities of switches will be discussed, but such discussion can be applied to any number of switches present. Thus, each switch can be electrically coupled to the baseboard 104 and, therefore, electrically coupled to the automated testing assembly 102. The automated testing assembly 102 can have a power supply module 116 (with a number of individual power supplies) and a plurality of input/output circuit cards 118 (with a number of individual cards).

Each switch of the plurality of switches 112a can be electrically coupled between the DUT socket 108 and the automated testing assembly 102 (e.g., to the cards 118) to selectively switch (on/off) testing of the integrated circuit device 110 between one of the memory devices 114a and 114b (depending on the particular switch being operated). This concept is specifically illustrated on FIG. 2A, which shows one example of a switch 112 being operable to switch between different types of testing (e.g., for memory, GPIO switching/Muxing, etc.). Here, the integrated circuit device 110 is tested by the automated testing assembly 102 for input/output leakage, via delam, and structural pattern content load and response port, etc. Upon operation of the switch 112, at least some (or all) of the testing signals from the integrated circuit device 110 are electrically switched (or routed) to the memory device 114 for associated memory testing processes on the integrated circuit device 110. The memory device 114 can be a dual in-line memory module (DIMM) memory chip. Notably, switch 112 (and other switches discussed herein) can be reprogrammed on-the-fly, meaning that software associated with operating the switch (i.e., of the test assembly 102) can be rewritten to fit a particular situation, such as when switching between different system tests of the integrated circuit device 110, or when testing a different integrated circuit device on the same DUT socket 108 and converged testing platform 106.

For example, the software that can be rewritten can be test operating software (TOS), which is known in the art and will not be discussed in great detail. However, it will be appreciated that the TOS can be dynamically rewritten during or after testing a particular device for a particular purpose. For example, if a particular tested integrated circuit device responded in a specific performance (or failure) mode, then a dynamic software algorithm could use the analytical (or historical) data tables to determine on-the-fly switching positions. This in turn would add or remove software classes to the testing flow to achieve the right mixture of outgoing quality and factory throughput.

In another example, the plurality of switches 112b can be electrically coupled between the DUT socket 108 and the automated testing assembly 102 to selectively switch testing of the integrated circuit device 110 (e.g., for system testing) using a first test port 113 (e.g., a debug port) and/or a second test port 115 (e.g., a boot ROM). Therefore, one or more switches of the plurality of switches 112b can be operated to turn on or off signaling between input/output card(s) 118 and the DUT socket 108, and to one or both of the first and second test ports 113 and 115. For example, if a particular tested integrated circuit device required additional testing to determine feature/performance quality, then a switch of switches 112b could be switched to add connectivity to items such as a solid state device (SSD) hard drive to load additional stressing content. The content on the hard drive could be custom software or commercially available software such as a personal computer operating system.

Figure 2A:
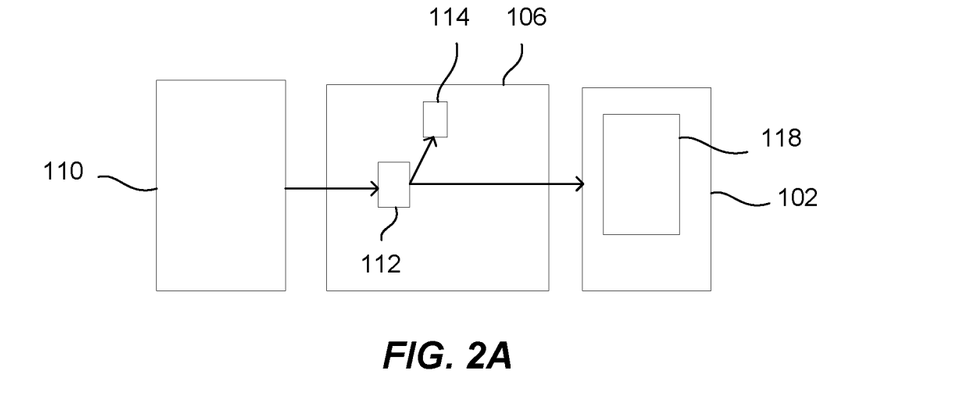
FIG. 2A illustrates a diagram of a testing system and process of the automated test system of FIG. 1 according to an example of the present disclosure.
Figure 2B:
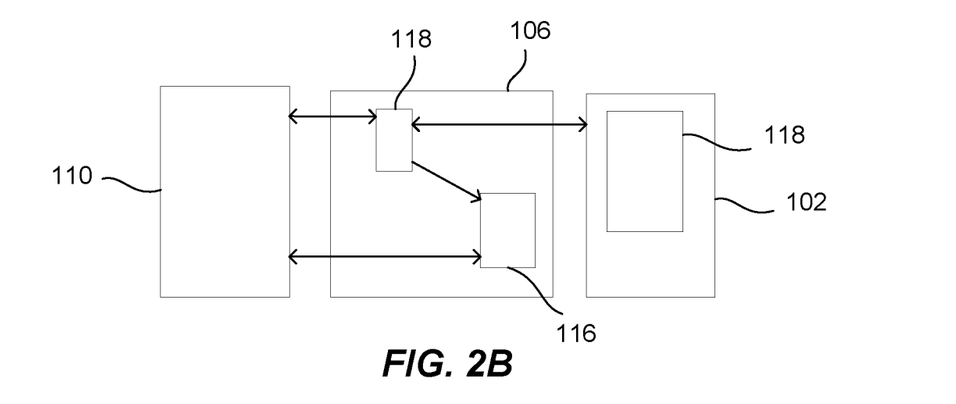
FIG. 2B illustrates a diagram of a testing system and process of the automated test system of FIG. 1 according to an example of the present disclosure.

In another example of switching (or Muxing) testing signals, FIG. 2B schematically illustrates a reprogrammable integrated circuit platform 116 removably coupled to the DUT socket 108. In one example, the integrated circuit platform 116 can be connected via an add-in card 117 (FIG. 1), which can have additional input/output interfaces for additional testing devices. The reprogrammable integrated circuit platform 116 can be a field-programmable gate array (FPGA) plugged into the DUT socket via the add-in card 117, for instance. As illustrated on FIG. 2B, the reprogrammable integrated circuit platform 116 is electrically connected to the integrated circuit device 108, such as through high-speed input/output connections of the add-in card connected to the DUT socket 110.

A relay switch 118 can be supported by the converged testing platform 106 and can operate as a relay switch for the reprogrammable integrated circuit platform 116. For example, the relay switch 118 can be electrically coupled to the automated testing assembly 102 and to the integrated circuit device 110 to facilitate the transfer of testing signals via the relay switch 118. The relay switch 118 can also be selectively electrically coupled to the reprogrammable integrated circuit platform 116 to switch signals to the reprogrammable integrated circuit platform 116 from the integrated circuit device 110, which can be all (or some) of the signals that would otherwise be transmitted to the automated testing assembly 102 from the integrated circuit device 110. Advantageously, the reprogrammable integrated circuit platform 116 can be removed from its socket and inserted into an external computer system for reprogramming for particular input/output testing processes for a particular integrated circuit to be tested. Also, an FPGA-based test agent provides faster response to test holes discovered either through validation or custom feedback because the FPGA can be reprogrammed to increase defect coverage as needed.

Figure 2C:
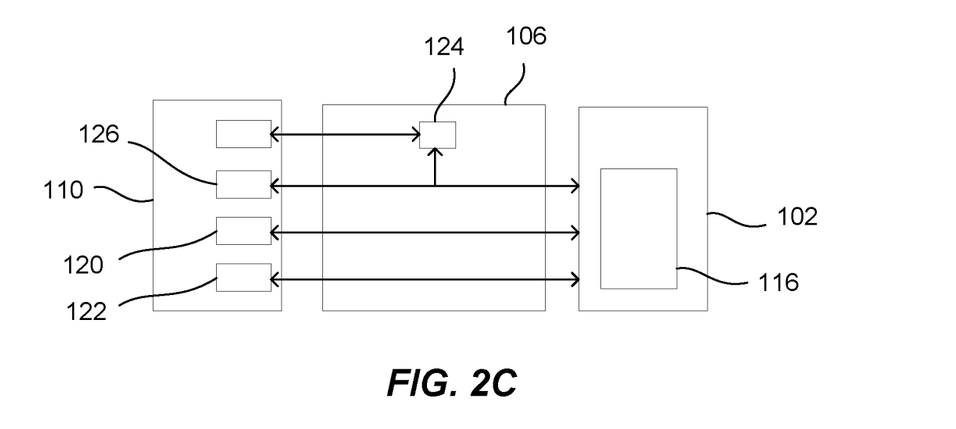
FIG. 2C illustrates a diagram of a testing system and process of the automated test system of FIG. 1 according to an example of the present disclosure.

FIG. 2C illustrates a schematic of class testing the integrated circuit device 110 with the power supply modules 116 of the automated testing assembly 102. One or more of the power supplies can be electrically coupled to GPIO rails 120 of the integrated circuit device 110 (on the DUT socket 108 of FIG. 1). Another (one or more) power supplies can be electrically coupled to power rails 122 via programmable supplies, for instance. An SVID controller 124 (serial voltage identification controller) can be supported on the converged test platform 106 and can be operated (by TOS) as a controller for SVID signal traffic. One power supply module of the automated testing assembly 102 can be electrically coupled to SVID rails 126 of the integrated circuit device 110 via programmable supplies, which can be routed to the SVID controller 124. The SVID controller 124 is also electrically coupled to an SVID enabled voltage rail 126 of the integrated circuit device 110 for power testing of the integrated circuit device 110.

With any of the switch configurations discussed herein, a test operating system (TOS) can be configured to control the flow of testing signals via any of the switches. For instance, when carrying out class testing the TOS would communicate to a particular switch to switch the connection to the automated testing assembly 102 while shutting off the testing signals to other testing electronic components, such as the memory devices on the converged testing platform. The inverse would be true when carrying out system test, such that the TOS would signal to the switch to shut off connection to the automated testing assembly 102 and facilitate signals to go to and from system test input/output testing electronic components.

When the integrated circuit device 110 is in wafer form, thereby requiring backend testing, the converted test platform 106 of FIG. 1 can be utilized for structuring logic testing. And when the integrated circuit device 110 is in packaged form, the converted test platform 106 can be utilized (in one testing flow process) for stress testing, structural logic testing, functional and fusion testing and system testing, for instance.

Figure 3:
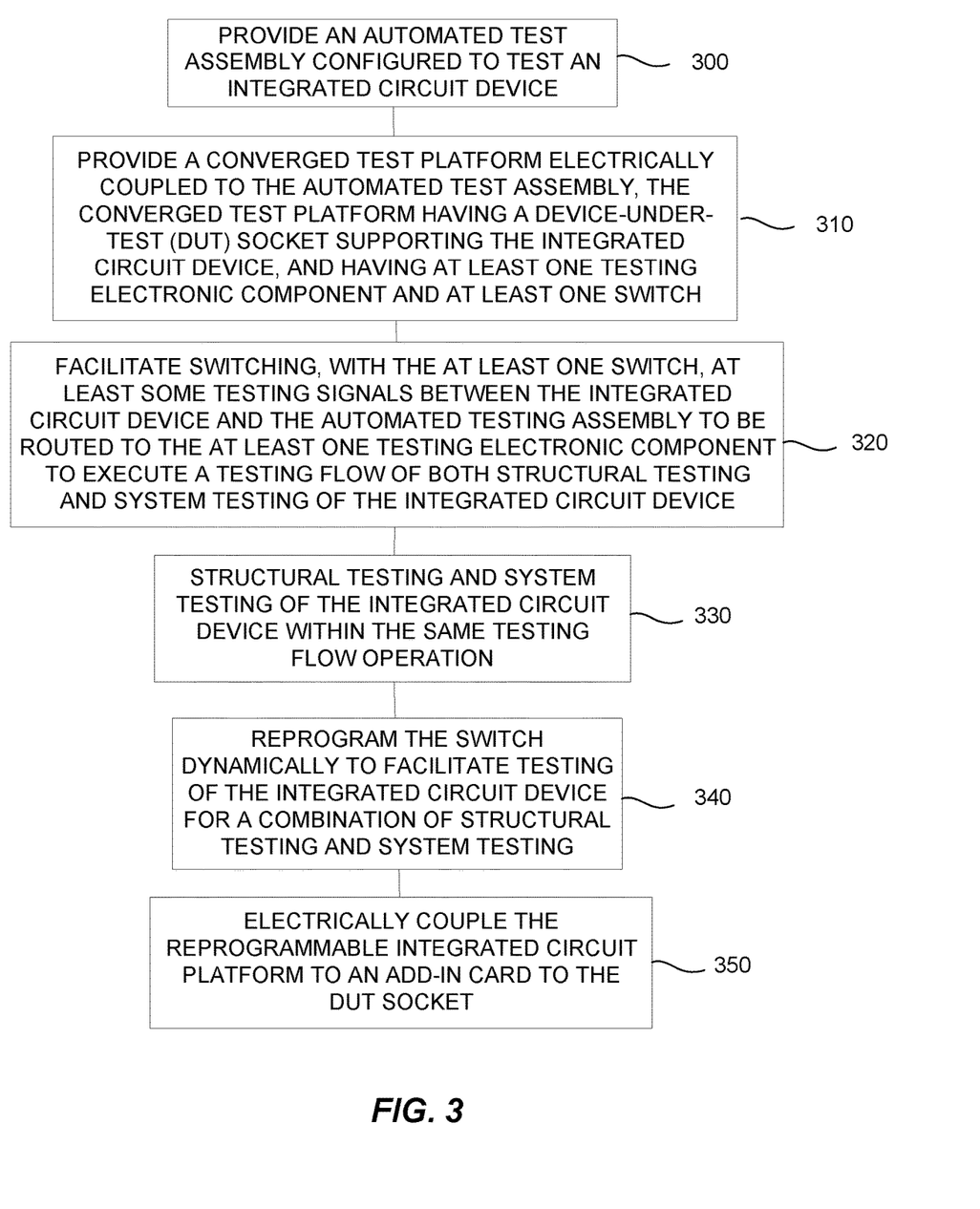
FIG. 3 illustrates a process of testing an integrated circuit device in according to an example of the present disclosure.

FIG. 3 illustrates an example of a testing process for structural testing and system testing of an integrated circuit device with a converged test platform operable with an automated test assembly, such as described regarding FIGS. 1-2C. The process can include operation 300 of providing an automated test assembly (e.g., 102 of FIG. 1) configured to test an integrated circuit device (e.g., 110 of FIG. 1). The process can include operation 310 of providing a converged test platform (e.g., 106 of FIG. 1) electrically coupled to the automated test assembly. As described regarding FIG. 1, the converged test platform can have a DUT socket (e.g., 108) supporting the integrated circuit device under test, and can have at least one testing electronic component (e.g., 114a, 114b, 113, 115, and/or 116 of FIG. 1) and at least one switch (such as any of the switches discussed regarding FIGS. 1-2C). The process can include operation 320 of facilitating switching, with the at least one switch, at least some testing signals between the integrated circuit device and the automated testing assembly to be routed to the at least one testing electronic component to facilitate both structural testing and system testing of the integrated circuit device, such as described regarding FIGS. 1-2C. The process can include operation 330 of structural testing and system testing of the integrated circuit device within the same testing flow operation via the automated test assembly, such as described regarding FIGS. 1-2C. The process can include operation 340 of reprogramming the switch dynamically to facilitate testing of the integrated circuit device for a combination of structural testing and system testing, such as described regarding FIGS. 1-2C. The process can include operation 350 of electrically coupling the reprogrammable integrated circuit platform to an add-in card to the DUT socket, such as described regarding FIGS. 1-2C.

In some examples, additional processes can be carried out after, before, or concurrently with the processes of FIG. 3, such as switching at least some test signals via the plurality of reprogrammable switches to the automated testing assembly. Another such process can be executing a testing flow of the integrated circuit device that comprises at least two of stress testing, structuring logic testing, functional and fusing testing, and system testing, such as described regarding FIGS. 1-2C. And yet another such process can be facilitating a test operating system to execute computer readable instructions that cause the switch to toggle between structural testing and system testing of the integrated circuit device, such as described regarding FIGS. 1-2C.

Figure 4:
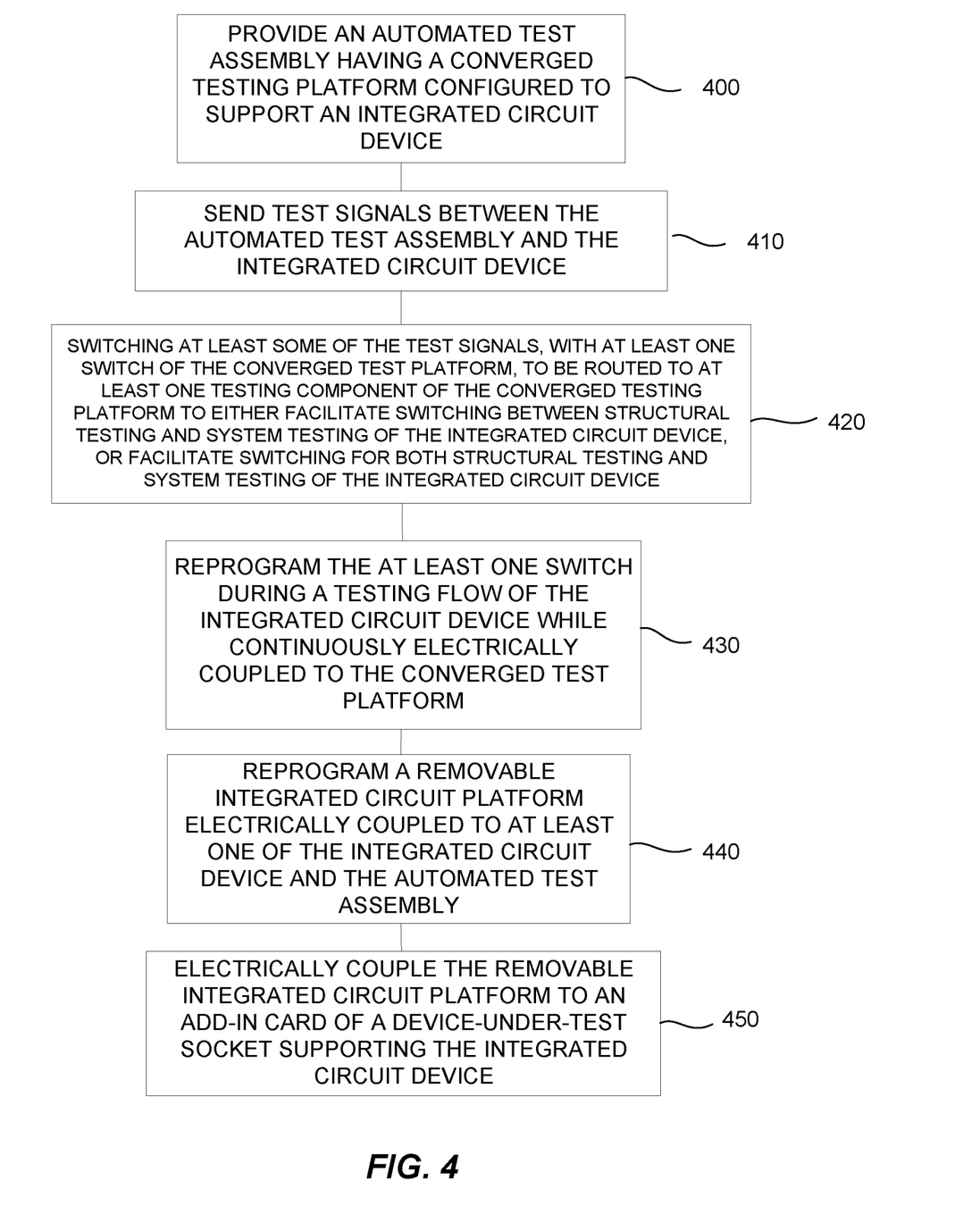
FIG. 4 illustrates a method of testing an integrated circuit device in according to an example of the present disclosure.

FIG. 4 illustrates an example of testing methods or operations for switching between structural testing and system testing of an integrated circuit device with a converged testing platform of an automated test assembly. The method can include operation 400 of providing an automated test assembly having a converged testing platform configured to support an integrated circuit device, such as described regarding FIGS. 1-2C. The automated test assembly can have a computer system with a processor configured to execute computer readable instructions configured to perform operations as follows: operation 410 of sending test signals between the automated test assembly (e.g., 102) and the integrated circuit device (e.g., 110), and operation 420 of switching at least some of the test signals, with at least one switch of the converged test platform, to be routed to at least one testing component of the converged testing platform to facilitate switching between structural testing and system testing of the integrated circuit device, such as described regarding FIGS. 1-2C. The method can include operation 430 (executed by the processor) of reprogramming the at least one switch during a testing flow of the integrated circuit device while continuously electrically coupled to the converged test platform. The method can include operation 440 (executed by the processor) of reprogramming a removable integrated circuit platform electrically coupled to at least one of the integrated circuit device and the automated test assembly. The method can include operation 450 (executed by the processor) of electrically coupling the removable integrated circuit platform to an add-in card of a DUT socket supporting the integrated circuit device. The operations of FIG. 4 can be carried out by the structural components and processes described with reference to FIGS. 1-2C.

EXAMPLES

The following examples pertain to further embodiments.

In one example there is provided a testing system having a converged test platform for structural testing and system testing of an integrated circuit device. The testing system comprises: an automated testing assembly; a baseboard electrically coupled to the automated testing assembly; and a converged test platform supported by the baseboard. The converged test platform comprises: a device-under-test (DUT) socket configured to electrically receive an integrated circuit device for testing; at least one testing electronic component selectively electrically coupled to the DUT socket; and at least one switch selectively operable to electrically switch at least some testing signals between the automated testing assembly and the DUT socket to the at least one testing electronic component for both structural testing and system testing of the integrated circuit device.

In one example, the at least one switch is reprogrammable to facilitate structural testing and system testing of the integrated circuit device.

In one example, the at least one testing electronic component comprises a reprogrammable integrated circuit platform.

In one example, the reprogrammable integrated circuit platform is directly electrically coupled to the DUT socket and separately electrically coupled to the at least one switch.

In one example, the reprogrammable integrated circuit platform comprises a field-programmable gate array.

In one example, an add-in card is supported by the converged test platform and electrically coupled to the DUT socket, wherein the reprogrammable integrated circuit platform is directly electrically coupled to the add-in card.

In one example, the at least one testing electronic component comprises a memory device.

In one example, the memory device comprises a dual in-line memory module.

In one example, the at least one testing electronic component comprises a plurality of memory devices and wherein the at least one switch comprises a plurality of reprogrammable switches operably coupled between the DUT socket and the plurality of memory devices.

In one example, the plurality of reprogrammable switches is further operably coupled to the automated testing assembly.

In one example, the at least one testing electronic component comprises a boot read-only memory device and a debug port, and wherein the at least one switch comprises a plurality of reprogrammable switches, wherein at least one of the plurality of reprogrammable switches is operably coupled between the DUT socket and the boot read-only memory device and a debug port.

In one example, the plurality of reprogrammable switches is further operably coupled to the automated testing assembly.

In one example, the integrated circuit comprises a packaged semiconductor unit, and wherein a testing flow of the packaged semiconductor unit comprises at least two of stress testing, structuring logic testing, functional and fusing testing, and system testing.

In one example, an SVID controller is electrically coupled between the DUT socket and the automated testing assembly.

In one example, the automated testing assembly comprises a high density modular test assembly.

In one example, the high density modular test assembly comprises a power supply module electrically coupled to the DUT socket and a plurality of input/output testing cards electrically coupled to the DUT socket.

In one example, the system comprises a test operating system having computer readable medium programmed to operate the switch to toggle between structural testing and system testing of the integrated circuit.

In one example, the computer readable medium is programmed to operate the switch to operate both structural testing and system testing of the integrated circuit via the automated test assembly and the at least one testing electronic component.

In one example, the integrated circuit device comprises a semiconductor wafer.

In one example there is provided a testing system having a converged test platform having at least one dynamically reprogrammable testing component. The testing system comprises: an automated testing assembly; a baseboard electrically coupled to the automated test assembly; and a converged test platform supported by the baseboard. The converged test platform comprises a device-under-test (DUT) socket configured to electrically receive an integrated circuit device for testing, and at least one of a dynamically reprogrammable integrated circuit platform and a dynamically reprogrammable switch, each selectively electrically coupled to at least one of the DUT socket and the automated testing assembly and configured to facilitate testing of both structural testing and system testing of the integrated circuit device.

In one example, the dynamically reprogrammable switch is configured to facilitate testing of the integrated circuit device for both structural testing and system testing.

In one example, the dynamically reprogrammable integrated circuit platform is directly electrically coupled to the DUT socket and separately electrically coupled to the dynamically reprogrammable switch.

In one example, the dynamically reprogrammable integrated circuit platform comprises a field-programmable gate array.

In one example, the system comprises an add-in card supported by the converged test platform and electrically coupled to the DUT socket, wherein the dynamically reprogrammable integrated circuit platform is directly electrically coupled to the add-in card.

In one example, the converged test platform further comprises at least one testing electronic component.

In one example, the at least one testing electronic component comprises a dual in-line memory module.

In one example, the converged test platform further comprises a plurality of memory devices and a plurality of dynamically reprogrammable switches operably coupled between the DUT socket and the plurality of memory devices.

In one example, the plurality of dynamically reprogrammable switches is further operably coupled to the automated testing assembly.

In one example, the at least one testing electronic component comprises a boot read-only memory device and a debug port, and wherein the plurality of dynamically reprogrammable switches is operably coupled between the DUT socket and the boot read-only memory device and a debug port.

In one example, the plurality of dynamically reprogrammable switches is further operably coupled to the automated testing assembly.

In one example, the integrated circuit comprises a packaged semiconductor unit, and wherein a testing flow of the packaged semiconductor unit comprises at least two of stress testing, structuring logic testing, functional and fusing testing, and system testing.

In one example, the automated testing assembly comprises a high density modular test assembly.

In one example, the high density modular test assembly comprises a power supply module electrically coupled to the DUT socket and a plurality of input/output testing cards electrically coupled to the DUT socket.

In one example, the testing system comprises a test operating system having computer readable medium is configured to operate the dynamically reprogrammable switch to toggle between structural testing and system testing of the integrated circuit.

In one example, the computer readable medium is configured to operate the dynamically reprogrammable switch to operate both structural testing and system testing of the integrated circuit device.

In one example, the integrated circuit device comprises a semiconductor wafer.

In one example there is provided a process for structural testing and system testing of an integrated circuit device with a converged test platform operable with an automated test assembly. The method comprises: providing an automated test assembly configured to test an integrated circuit device; providing a converged test platform electrically coupled to the automated test assembly, the converged test platform having a device-under-test (DUT) socket supporting the integrated circuit device, and having at least one testing electronic component and at least one switch; and facilitating switching, with the at least one switch, at least some testing signals between the integrated circuit device and the automated testing assembly to be routed to the at least one testing electronic component to facilitate both structural testing and system testing of the integrated circuit device.

In one example, the structural testing and system testing of the integrated circuit device within the same testing flow operation via the automated test assembly.

In one example, the process comprises reprogramming the switch dynamically to facilitate testing of the integrated circuit device for a combination of structural testing and system testing.

In one example, the at least one testing electronic component comprises a reprogrammable integrated circuit platform.

In one example, the reprogrammable integrated circuit platform is directly electrically coupled to the DUT socket and separately electrically coupled to the at least one switch.

In one example, the reprogrammable integrated circuit platform comprises a field-programmable gate array.

In one example, the process comprises electrically coupling the reprogrammable integrated circuit platform to an add-in card to the DUT socket.

In one example, the at least one testing electronic component comprises a dual in-line memory module.

In one example, the at least one testing electronic component comprises a plurality of memory devices and wherein the at least one switch comprises a plurality of reprogrammable switches operably coupled between the DUT socket and the plurality of memory devices.

In one example, the process comprises switching at least some test signals via the plurality of reprogrammable switches to the automated testing assembly.

In one example, the at least one testing electronic component comprises a boot read-only memory device and a debug port, and wherein the at least one switch comprises a plurality of reprogrammable switches, wherein at least one of the plurality of reprogrammable switches is operably coupled between the DUT socket and the boot read-only memory device and a debug port.

In one example, the process comprises executing a testing flow of the integrated circuit device that comprises at least two of stress testing, structuring logic testing, functional and fusing testing, and system testing.

In one example, the automated testing assembly comprises a high density modular test assembly.

In one example, the process comprises facilitating a test operating system to execute computer readable instructions that cause the switch to toggle between structural testing and system testing of the integrated circuit device.

In one example, the computer readable instructions cause the switch to operate both structural testing and system testing of the integrated circuit via the automated test assembly and the at least one testing electronic component.

In one example there is provided a method for switching between structural testing and system testing of an integrated circuit device with a converged testing platform of an automated test assembly. The method comprises: providing an automated test assembly having a converged testing platform configured to support an integrated circuit device. The automated test assembly has a computer system with a processor configured to execute computer readable instructions configured to perform the method of: sending test signals between the automated test assembly and the integrated circuit device; and switching at least some of the test signals, with at least one switch of the converged test platform, to be routed to at least one testing component of the converged testing platform to facilitate switching between structural testing and system testing of the integrated circuit device.

In one example, the method comprises reprogramming the at least one switch during a testing flow of the integrated circuit device while continuously electrically coupled to the converged test platform.

In one example, the method comprises reprogramming a removable integrated circuit platform electrically coupled to at least one of the integrated circuit device and the automated test assembly.

In one example, the removable integrated circuit platform is electrically coupled to the integrated circuit device and separately electrically coupled to the at least one switch.

In one example, the removable integrated circuit platform comprises a field-programmable gate array.

In one example, the method comprises electrically coupling the removable integrated circuit platform to an add-in card of a device-under-test socket supporting the integrated circuit device.

In one example, the method comprises switching at least some test signals transmitted to the integrated testing device via a plurality of switches supported by the converged test platform.

In one example, the method comprises reprogramming at least some of the plurality of switches while the integrated circuit device remains coupled to a device-under-test (DUT) socket of the converged test platform.

In one example, the method comprises executing a testing flow that comprises at least two of stress testing, structuring logic testing, functional and fusing testing, and system testing of the integrated circuit device.

In one example, the automated testing assembly comprises a high density modular test assembly.

In one example, the method comprises facilitating switching such that both structural testing and system testing is performed on the integrated circuit device.

In one example there is provided a converged test device operable with a testing system for structural testing and system testing of an integrated circuit device. The converged test platform comprises: a personality card substrate; a device-under-test (DUT) socket supported by the personality card substrate and configured to electrically receive an integrated circuit device for testing; a testing electronic component coupled to the DUT socket; and a testing switch selectively electrically coupled to the DUT socket and the testing electronic component, the testing switch operable to electrically switch at least some testing signals between a testing system and the DUT socket to the testing electronic component for both structural testing and system testing of the integrated circuit device.

In one example, the testing switch is reprogrammable to facilitate structural testing and system testing of the integrated circuit device.

In one example, the at least one testing electronic component comprises a reprogrammable integrated circuit platform.

In one example, the reprogrammable integrated circuit platform is directly electrically coupled to the DUT socket and separately electrically coupled to the testing switch.

In one example, the reprogrammable integrated circuit platform comprises a field-programmable gate array.

In one example, the converged testing device comprises an add-in card supported by the converged test platform and electrically coupled to the DUT socket, wherein the reprogrammable integrated circuit platform is directly electrically coupled to the add-in card.

In one example, the testing electronic component comprises a memory device.

In one example, the memory device comprises a dual in-line memory module.

In one example, the converged testing device comprises a plurality of memory devices and a plurality of reprogrammable switches operably coupled between the DUT socket and a plurality of memory devices on the personality card substrate.

In one example, the testing electronic component comprises one of a boot read-only memory device and a debug port, and wherein the testing switch is operably coupled between one of the boot read-only memory device and a debug port.

In one example, the integrated circuit comprises a packaged semiconductor unit, and wherein a testing flow of the packaged semiconductor unit comprises at least two of stress testing, structuring logic testing, functional and fusing testing, and system testing.

Circuitry used in electronic components or devices (e.g. a die) of an electronic device package can include hardware, firmware, program code, executable code, computer instructions, and/or software. Electronic components and devices can include a non-transitory computer readable storage medium which can be a computer readable storage medium that does not include signal. In the case of program code execution on programmable computers, the computing devices recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:

1. A testing system having a converged test platform for structural testing and system testing of an integrated circuit device, the testing system comprising:
   an automated testing assembly;
   a baseboard electrically coupled to the automated testing assembly; and
   a converged test platform supported by the baseboard and comprising:
      a device-under-test (DUT) socket configured to electrically receive an integrated circuit device for testing;
      at least one testing electronic component selectively electrically coupled to the DUT socket; and
      at least one switch selectively operable to electrically switch at least some testing signals between the automated testing assembly and the DUT socket to the at least one testing electronic component for both structural testing and system testing of the integrated circuit device.

2. The testing system of claim 1, wherein the at least one switch is reprogrammable to facilitate structural testing and system testing of the integrated circuit device.

3. The testing system of claim 1, wherein the at least one testing electronic component comprises a reprogrammable integrated circuit platform.

4. The testing system of claim 3, wherein the reprogrammable integrated circuit platform is directly electrically coupled to the DUT socket and separately electrically coupled to the at least one switch.

5. The testing system of claim 3, wherein the reprogrammable integrated circuit platform comprises a field-programmable gate array.

6. The testing system of claim 3, further comprising an add-in card supported by the converged test platform and electrically coupled to the DUT socket, wherein the reprogrammable integrated circuit platform is directly electrically coupled to the add-in card.

7. The testing system of claim 1, wherein the at least one testing electronic component comprises a memory device.

8. The testing system of claim 7, wherein the memory device comprises a dual in-line memory module.

9. The testing system of claim 1, wherein the at least one testing electronic component comprises a plurality of memory devices and wherein the at least one switch comprises a plurality of reprogrammable switches operably coupled between the DUT socket and the plurality of memory devices.

10. The testing system of claim 9, wherein the plurality of reprogrammable switches is further operably coupled to the automated testing assembly.

11. The testing system of claim 1, wherein the at least one testing electronic component comprises a boot read-only memory device and a debug port, and wherein the at least one switch comprises a plurality of reprogrammable switches, wherein at least one of the plurality of reprogrammable switches is operably coupled between the DUT socket and the boot read-only memory device and a debug port.

12. The testing system of claim 11, wherein the plurality of reprogrammable switches is further operably coupled to the automated testing assembly.

13. The testing system of claim 1, wherein the integrated circuit comprises a packaged semiconductor unit, and wherein a testing flow of the packaged semiconductor unit comprises at least two of stress testing, structuring logic testing, functional and fusing testing, and system testing.

14. The testing system of claim 1, wherein further comprising an SVID controller electrically coupled between the DUT socket and the automated testing assembly.

15. The testing system of claim 1, wherein the automated testing assembly comprises a high density modular test assembly.

16. The testing system of claim 15, wherein the high density modular test assembly comprises a power supply module electrically coupled to the DUT socket and a plurality of input/output testing cards electrically coupled to the DUT socket.

17. The testing system of claim 1, further comprising a test operating system having computer readable medium programmed to operate the switch to toggle between structural testing and system testing of the integrated circuit.

18. The testing system of claim 17, wherein the computer readable medium is programmed to operate the switch to operate both structural testing and system testing of the integrated circuit via the automated test assembly and the at least one testing electronic component.

19. The testing system of claim 1, wherein the integrated circuit device comprises a semiconductor wafer.

20. A process for structural testing and system testing of an integrated circuit device with a converged test platform operable with an automated test assembly, the method comprising:
   providing an automated test assembly configured to test an integrated circuit device;
   providing a converged test platform electrically coupled to the automated test assembly, the converged test platform having a device-under-test (DUT) socket supporting the integrated circuit device, and having at least one testing electronic component and at least one switch; and
      facilitating switching, with the at least one switch, at least some testing signals between the integrated circuit device and the automated testing assembly to be routed to the at least one testing electronic component to facilitate both structural testing and system testing of the integrated circuit device.

21. The process of claim 20, further comprising structural testing and system testing of the integrated circuit device within the same testing flow operation via the automated test assembly.

22. The process of claim 20, wherein the at least one testing electronic component comprises a reprogrammable integrated circuit platform.

23. The process of claim 20, wherein the at least one testing electronic component comprises a dual in-line memory module.

24. The process of claim 20, wherein the at least one testing electronic component comprises a plurality of memory devices and wherein the at least one switch comprises a plurality of reprogrammable switches operably coupled between the DUT socket and the plurality of memory devices.

25. The process of claim 20, wherein the at least one testing electronic component comprises a boot read-only memory device and a debug port, and wherein the at least one switch comprises a plurality of reprogrammable switches, wherein at least one of the plurality of reprogrammable switches is operably coupled between the DUT socket and the boot read-only memory device and a debug port.

26. The process of claim 20, further comprising executing a testing flow of the integrated circuit device that comprises at least two of stress testing, structuring logic testing, functional and fusing testing, and system testing.

27. The process of claim 20, wherein the automated testing assembly comprises a high density modular test assembly.

28. The process of claim 20, further comprising facilitating a test operating system to execute computer readable instructions that cause the switch to toggle between structural testing and system testing of the integrated circuit device.

* * * * *